United States Patent
Skunes et al.

(10) Patent No.: US 6,744,499 B2
(45) Date of Patent: Jun. 1, 2004

(54) CALIBRATION METHODS FOR PLACEMENT MACHINES INCORPORATING ON-HEAD LINESCAN SENSING

(75) Inventors: Timothy A. Skunes, Mahtomedi, MN (US); Eric P. Rudd, Hopkins, MN (US); David W. Duquette, Minneapolis, MN (US)

(73) Assignee: CyberOptics Corporation, Golden Valley, MN (US)

( * ) Notice: Subject to any disclaimer, the term of this patent is extended or adjusted under 35 U.S.C. 154(b) by 0 days.

(21) Appl. No.: 10/337,644

(22) Filed: Jan. 7, 2003

(65) Prior Publication Data

US 2003/0156297 A1 Aug. 21, 2003

Related U.S. Application Data

(62) Division of application No. 09/589,020, filed on Jun. 7, 2000, now Pat. No. 6,535,291.

(51) Int. Cl.[7] .................................................. G01J 1/10
(52) U.S. Cl. ..................................... 356/243.1; 382/151
(58) Field of Search .......................... 356/243.1–243.5, 356/401, 614; 382/151, 287; 348/87

(56) References Cited

U.S. PATENT DOCUMENTS

| | | | |
|---|---|---|---|
| 4,473,842 A | 9/1984 | Suzuki et al. | 358/107 |
| 4,521,112 A | 6/1985 | Kuwabara et al. | 356/375 |
| 4,578,810 A | 3/1986 | MacFarlane et al. | 382/8 |
| 4,615,093 A | 10/1986 | Tews et al. | 29/407 |
| 4,675,993 A | 6/1987 | Harada | 29/740 |
| 4,700,398 A | 10/1987 | Mizuno et al. | 382/1 |
| 4,706,379 A | 11/1987 | Seno et al. | 29/740 |
| 4,727,471 A | 2/1988 | Driels et al. | 364/167 |
| 4,738,025 A | 4/1988 | Arnold | 29/834 |
| 4,743,768 A | 5/1988 | Watannabe | 250/556 |
| 4,772,125 A | 9/1988 | Yoshimura et al. | 356/237 |
| 4,782,273 A | 11/1988 | Moynagh | 318/568 |

(List continued on next page.)

FOREIGN PATENT DOCUMENTS

| | | |
|---|---|---|
| DE | 198 26 555 A1 | 12/1999 |
| EP | 0 664 666 A1 | 1/1994 |
| EP | 0 942 641 A2 | 9/1997 |
| EP | 0 854 671 A1 | 7/1998 |
| EP | 0 730 397 B1 | 4/1999 |
| JP | 2 18900 | 7/1990 |
| JP | 2-275700 | 11/1990 |

(List continued on next page.)

OTHER PUBLICATIONS

"A Stereo Imagining System for Dimensional Measurement," by Robert C. Chang, SPI, vol. 2909, pp. 50–57 (undated).

"A New Sense for Depth of Field," by A. Pentland, IEEE Trans. Pattern Anal. Machine Intell. 9, pp. 523–531 (1987).

"Application of Modulation Measurement Profilometry to Objects With Surface Holes," by Likun et al., Applied Optics, vol. 38, No. 7, pp. 1153–1158.

(List continued on next page.)

*Primary Examiner*—Hoa Q. Pham
(74) *Attorney, Agent, or Firm*—Westman, Champlin & Kelly, P.A.

(57) ABSTRACT

A method of calibrating a pick and place machine having an on-head linescan sensor is disclosed. The calibration includes obtaining z-axis height information of one or more nozzle tips via focus metric methods, including a Fourier transform method and a normalized correlation method. Additionally, other physical characteristics such as linear detector tilt, horizontal scale factor, and vertical scale factor are measured and compensated for in the process of placing the component. Nozzle runout, another physical characteristic, is also measured by a sinusoidal curve fit method, and the resulting Z-height calibration data is used to later place the component.

13 Claims, 9 Drawing Sheets

U.S. PATENT DOCUMENTS

| | | | |
|---|---|---|---|
| 4,811,410 A | 3/1989 | Amir et al. | 382/8 |
| 4,875,778 A | 10/1989 | Luebbe et al. | 356/394 |
| 4,876,728 A | 10/1989 | Roth | 382/21 |
| 4,920,429 A | 4/1990 | Jaffe et al. | 358/471 |
| 4,942,618 A | 7/1990 | Sumi et al. | 382/8 |
| 4,959,898 A | 10/1990 | Landman et al. | 29/705 |
| 4,969,108 A | 11/1990 | Webb et al. | 364/513 |
| 4,973,216 A | 11/1990 | Domm | 414/744.5 |
| 4,980,971 A | 1/1991 | Bartschat et al. | 29/833 |
| 5,030,008 A | 7/1991 | Scott et al. | 356/394 |
| 5,046,113 A | 9/1991 | Hoki | 382/8 |
| 5,084,959 A | 2/1992 | Ando et al. | 29/740 |
| 5,084,962 A | 2/1992 | Takahashi et al. | 29/833 |
| 5,086,559 A | 2/1992 | Akatsuchi | 29/834 |
| 5,096,353 A | 3/1992 | Tesh et al. | 414/225 |
| 5,099,522 A | 3/1992 | Morimoto | 382/8 |
| 5,140,643 A | 8/1992 | Izumi et al. | 382/8 |
| 5,148,591 A | 9/1992 | Pryor | 29/407 |
| 5,195,234 A | 3/1993 | Pine et al. | 29/720 |
| 5,208,463 A | 5/1993 | Honma et al. | 250/561 |
| 5,233,745 A | 8/1993 | Morita | 29/705 |
| 5,237,622 A | 8/1993 | Howell | 382/8 |
| 5,249,239 A | 9/1993 | Kida | 382/8 |
| 5,249,349 A | 10/1993 | Kuinose et al. | 29/721 |
| 5,278,634 A | 1/1994 | Skunes et al. | 356/400 |
| 5,309,522 A | 5/1994 | Dye | 382/41 |
| 5,342,460 A | 8/1994 | Hidese | 156/64 |
| 5,369,492 A | 11/1994 | Sugawara | 356/394 |
| 5,377,405 A | 1/1995 | Sakurai et al. | 29/833 |
| 5,379,514 A | 1/1995 | Okuda et al. | 29/833 |
| 5,383,270 A | 1/1995 | Iwatsuka et al. | 29/840 |
| 5,403,140 A | 4/1995 | Carmichael et al. | 414/280 |
| 5,434,629 A | 7/1995 | Pearson et al. | 348/721 |
| 5,452,370 A | 9/1995 | Nagata | 382/153 |
| 5,456,003 A | 10/1995 | Yamamoto et al. | 29/840 |
| 5,461,480 A | 10/1995 | Yamada et al. | 356/394 |
| 5,491,888 A | 2/1996 | Sakurai et al. | 29/832 |
| 5,523,663 A | 6/1996 | Tsuge et al. | 318/568.16 |
| 5,537,204 A * | 7/1996 | Woodhouse | 356/243.1 |
| 5,541,834 A | 7/1996 | Tomigashi et al. | 364/167.01 |
| 5,555,090 A | 9/1996 | Schmutz | 356/381 |
| 5,559,727 A | 9/1996 | Deley et al. | 364/559 |
| 5,560,100 A | 10/1996 | Englert | 29/833 |
| 5,566,447 A | 10/1996 | Sakurai | 295/832 |
| 5,592,563 A | 1/1997 | Zahavi | 382/154 |
| 5,608,642 A | 3/1997 | Onodera | 364/478.01 |
| 5,619,328 A | 4/1997 | Sakurai | 356/375 |
| 5,660,519 A | 8/1997 | Ohta et al. | 414/783 |
| 5,661,561 A | 8/1997 | Wurz et al. | 356/386 |
| 5,671,527 A | 9/1997 | Asai et al. | 29/740 |
| 5,694,219 A | 12/1997 | Kim | 356/375 |
| 5,724,722 A | 3/1998 | Hashimoto | 29/740 |
| 5,743,005 A | 4/1998 | Nakao et al. | 29/833 |
| 5,768,759 A | 6/1998 | Hudson | 29/407.04 |
| 5,777,746 A | 7/1998 | Dlugos | 356/380 |
| 5,787,577 A | 8/1998 | Kent | 29/833 |
| 5,832,107 A | 11/1998 | Choate | 382/154 |
| 5,839,186 A | 11/1998 | Onodera | 29/720 |
| 5,855,059 A | 1/1999 | Togami et al. | 297/740 |
| 5,864,944 A | 2/1999 | Kashiwagi et al. | 29/833 |
| 5,878,484 A | 3/1999 | Araya et al. | 29/740 |
| 5,999,266 A | 12/1999 | Takahashi et al. | 356/376 |
| 5,999,640 A | 12/1999 | Hatase et al. | 382/151 |
| 6,018,865 A | 2/2000 | Michael | 29/740 |
| 6,031,242 A | 2/2000 | Hudson | 250/548 |
| 6,043,877 A * | 3/2000 | Land | 356/243.1 |
| 6,050,151 A * | 4/2000 | Larson | 73/865.9 |
| 6,055,049 A * | 4/2000 | Mueller | 356/243.1 |
| 6,118,538 A | 9/2000 | Haugan et al. | 356/375 |
| 6,195,165 B1 * | 2/2001 | Sayegh | 356/613 |
| 6,232,724 B1 | 5/2001 | Onimoto et al. | 315/161 |
| 6,243,164 B1 | 6/2001 | Baldwin et al. | 356/375 |
| 6,291,816 B1 | 9/2001 | Liu | 250/234 |
| 6,342,916 B1 * | 1/2002 | Kashiwagi et al. | 348/87 |
| 6,490,048 B1 * | 12/2002 | Rudd et al. | 356/601 |
| 6,535,291 B1 * | 3/2003 | Skunes et al. | 356/614 |
| 6,583,884 B2 * | 6/2003 | Rudd et al. | 356/601 |

FOREIGN PATENT DOCUMENTS

| | | |
|---|---|---|
| JP | 2-306700 | 12/1990 |
| JP | 3-030499 | 2/1991 |
| JP | 3-110898 | 5/1991 |
| JP | 3-265198 | 11/1991 |
| JP | 3-117898 | 12/1991 |
| JP | 3-289197 | 12/1991 |
| JP | 3-293800 | 12/1991 |
| JP | 3-104300 | 2/1992 |
| JP | 4-051598 | 2/1992 |
| JP | 4-064292 | 2/1992 |
| JP | 4-083400 | 3/1992 |
| JP | 4-107988 | 4/1992 |
| JP | 4-107993 | 4/1992 |
| JP | 4-262201 | 9/1992 |
| JP | 4-271200 | 9/1992 |
| JP | 5-053360 | 7/1993 |
| JP | 4-311100 | 11/1993 |
| JP | 5-335793 | 12/1993 |
| JP | 7-020960 | 8/1994 |
| JP | 6-291490 | 10/1994 |
| JP | 6-310899 | 11/1994 |
| JP | 7-336099 | 12/1995 |
| JP | 8-005335 | 1/1996 |
| JP | 8-018289 | 1/1996 |
| JP | 8-032299 | 2/1996 |
| JP | 8-043025 | 2/1996 |
| JP | 8-046396 | 2/1996 |
| JP | 8-167799 | 6/1996 |
| JP | 2554424 | 8/1996 |
| JP | 2554437 | 8/1996 |
| JP | 9-023097 | 1/1997 |
| JP | 9-246799 | 9/1997 |
| JP | 9-292998 | 11/1997 |
| JP | 9-293998 | 11/1997 |
| JP | 9-307286 | 11/1997 |
| JP | 9-307297 | 11/1997 |
| JP | 2847801 B2 | 1/1999 |
| JP | 2000-299600 | 4/1999 |
| JP | 2000-312100 | 4/1999 |
| JP | P3186387 | 7/2001 |
| WO | WO 99/42257 | 8/1999 |
| WO | WO 00/26611 | 5/2000 |

OTHER PUBLICATIONS

"A Matrix Based Method for Determining Depth From Focus," by J. Ens and P. Lawrence, in Proceedings of IEEE Conference on Computer Vision and Pattern Recognition (Institute of Electrical and Electronics Engineers, New Your, pp. 600–609 (1991).

"Library of C/C++ Machine Vision Software Routines," Imagining Technology, pp. 63–68 (1999).

"A Perspective on Range Finding Technique for Compute Vision," by R.A. Jarvis, IEEE Trans. Pattern Anal. Machine Intell. 5, pp. 122–139 (1983).

"Real Time Computation of Depth from DeFocus," by Watanabe et al., SPIE, vol. 2599, pp. 14–25 (undated).

"Root–Mean Square Error in Passive Autofocusing and 3D Shape Recovery," by Subbarao et al., SPIE, vol. 2909, pp. 162–177 (undated).

"Pyramid Based Depth from Focus," by T. Darrel and K. Wohn, in Proceedings of IEEE Conference on Computer Vision and Pattern Recognition (Institute of Electrical and Electronics Engineers, New York), pp. 504–509 (1988).

"SP–11–xxx40 Compact Line Scan Camera," downloaded from www.dalsa.com, pp. 1–6 (undated).

Copy of International Search Report from Application No. PCT/US01/07810 with international filing date of Mar. 13, 2001.

U.S. patent application Ser. No. 09/432,552, Case et al., filed Nov. 3, 1999.

U.S. patent application Ser. No. 09/434,320, Skunes, filed Nov. 4, 1999.

U.S. patent application Ser. No. 09/434,325, Case, filed Nov. 4, 1999.

U.S. patent application Ser. No. 09/524,071, Skunes, filed Mar. 13, 2000.

U.S. patent application Ser. No. 09/589,020, Skunes et al., filed Jun. 7, 2000.

* cited by examiner

CALIBRATION METHODS FOR PLACEMENT MACHINES INCORPORATING ON-HEAD LINESCAN SENSING

The present application is a divisional of and claims priority of U.S. patent application Ser. No. 09/589,020, filed Jun. 7, 2000 now U.S. Pat. No. 6,535,291, the content of which is hereby incorporated by reference in its entirety.

COPYRIGHT RESERVATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

The present invention relates to pick and place machines. More particularly, the present invention relates to a method of calibrating pick and place machines.

Pick and place machines are used by the electronics assembly industry to mount individual components on printed circuit boards. These machines automate the tedious process of placing individual electrical components on the circuit board. In operation, pick and place machines generally pick up individual components from a component feeder or the like, and place the components in their respective positions on a circuit board.

During the placement operation, it is generally necessary for the pick and place machine to look at, or image, a given component prior to placement in order to adjust the orientation of the component for proper placement. Such imaging allows precise adjustments to be made to the component's orientation, such that the component will be accurately placed in its desired position.

One standard type of pick and place machine uses a shadowing sensor, such as a LaserAlign® sensor available from CyberOptics® Corporation of Golden Valley, Minn. In a shadowing sensor, the object under test is rotated, and the effective width of the shadow (or an image of the shadow) is monitored on a detector. The dimensions of the object can be computed by monitoring the width of the shadow (or the shadow image). During start-up, the pick and place machine is calibrated so that any positional output from the sensor is mathematically related to the pick and place machine coordinate system. Once a correlation between the pick and place machine and the sensor output is known in X and Y, the pick and place machine can accurately place the object under test in its intended (X,Y) location on, say, a printed circuit board. There are also disclosed methods of calibrating the Z-height of a nozzle, so that the pick and place machine can repeatably place the object onto the intended place at the correct Z height. However, the methods disclosed for calibrating pick and place machines in (X,Y) and in Z are specific to the type of sensor in the pick and place machine.

Another type of pick and place machine uses an on-head linescan sensor to image the component while the placement head is traveling. An on-head sensor, as used herein, refers to a sensor which travels with the placement head in at least one dimension, so as to sense the orientation of the component while the component travels to the circuit board. This is in contrast to off-head systems, where the component is transported to a stationary station to sense the orientation of the component, and from there, the component is transported to the circuit board. A linescan sensor, as used herein, is an optical sensor comprised of a plurality of light sensitive elements that are arranged in a line such that the sensor acquires a single line of the image in a given time period. By translating the linescan sensor relative to the entire component and storing a plurality of the acquired lines, the component image is realized and X, Y and θ orientation is then calculated using this scanned image.

Placement machines incorporating on-head linescan sensing technology are very flexible in the types of components that they can place. The on-head linescan sensor is able to directly image components such as chip capacitors, Quad Flat Packs (QFP), TSOP, Ball Grid Arrays (BGA), CSP, and flip-chips. The video output of the linescan camera allows a video processor to compute the orientation of the component. Based on knowledge of the desired orientation of the component and the present orientation, the pick and place machine corrects the orientation of the component and places it on a printed circuit board. The linescan image can also provide inspection information about the component to be placed. Also, placement machines incorporating on-head linescan sensing are very fast compared to off-head sensing technologies since the step of visiting a fixed inspection station to measure pick-up offset errors is eliminated. To increase the accuracy of pick and place machines using on-head linescan sensing technology, however, careful calibration of the linescan sensor and its physical relationship to other parts of the placement machine should be performed.

SUMMARY OF THE INVENTION

A method of calibrating a pick and place machine having an on-head linescan sensor is disclosed. The calibration includes obtaining z-axis height information of one or more nozzle tips via focus metric methods, including a Fourier transform method and a normalized correlation method. Additionally, other physical characteristics such as linear detector tilt, horizontal scale factor, and vertical scale factor are measured and compensated for in the process of placing the component. Nozzle runout, another physical characteristic, is also measured by a sinusoidal curve fit method, and the resulting Z-height calibration data is used to later place the component.

DETAILED DESCRIPTION OF THE PREFERRED EMBODIMENTS

Figure 1:
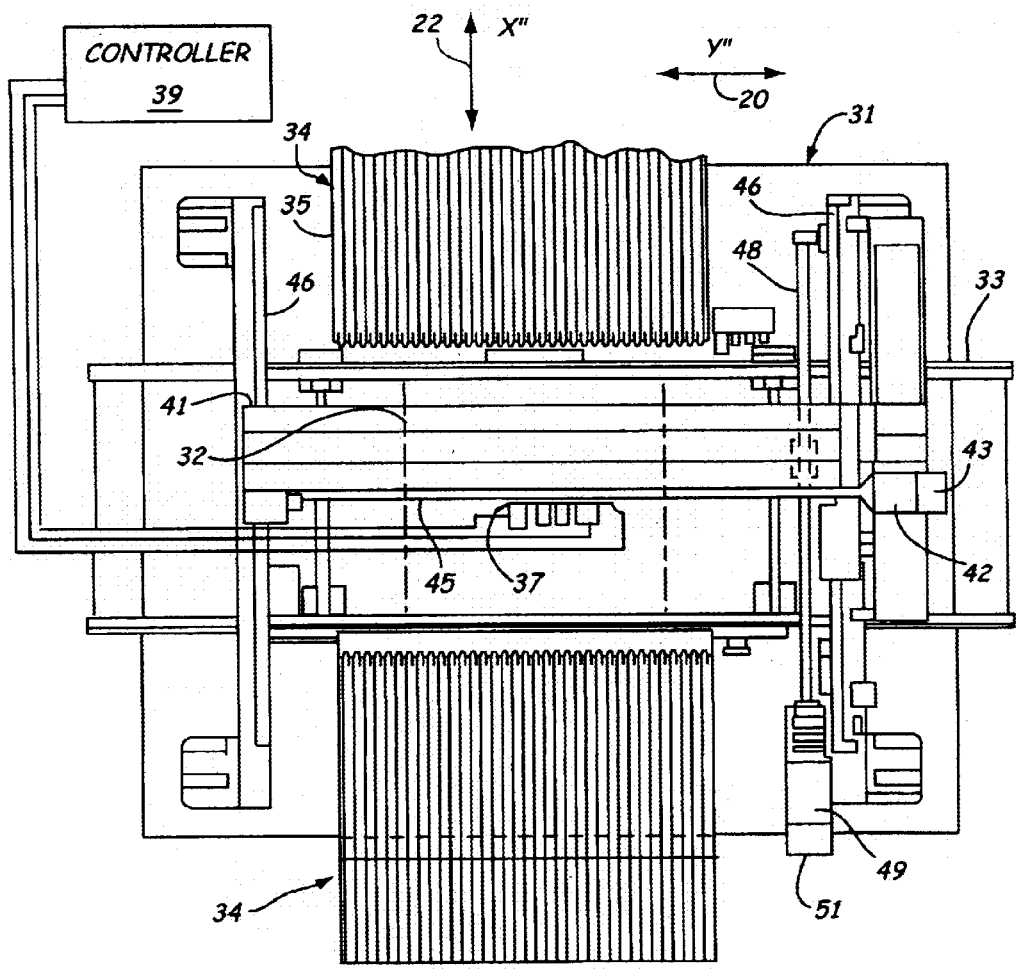
FIG. 1 is a top plan view of a pick and place machine.

FIG. 1 is a top plan view of pick and place machine 31 in accordance with an embodiment of the present invention. Pick and place machine 31 is adapted to mount a variety of electrical components such as chip resistors, chip capacitors, flip-chips, Ball Grid Arrays (BGA), Quad Flat Packs (QFP), and connectors on a workpiece 32 such as a printed circuit board.

As various methods are disclosed, it will be apparent that there are three relevant coordinate systems. Interrelationships between all three must be known in order to accurately and repeatably place a component in an intended location. Coordinates of the scanned image are denoted with a single prime after the coordinate (i.e. (X',Y',Z')). Coordinates of the linescan sensor stage are denoted without any prime notation (i.e. (X,Y,Z)); the pick and place coordinate system is denoted by a double prime notation (i.e. (X",Y",Z")) and the coordinate system of a target is denoted in a triple prime labeling convention (i.e. (X'",Y'",Z'")).

The individual components are picked up from feeders 34 which are disposed on opposite sides of conveyor 33. Feeders 34 can be known tape feeders, or any other suitable device.

Pick and place head 37 is adapted to releasably pick up components from feeders 34 and transport such components to their respective mounting locations upon workpiece 32. Head 37 will be described in greater detail with respect to FIG. 2. Head 37 is movably disposed upon carriage 41, and is coupled to drive motor 42 via a ballscrew or other appropriate means. Thus, energization of motor 42 causes displacement of head 37 in the Y" direction along carriage 41, as indicated by arrow 20. Motor 42 is coupled to encoder 43 which provides a Y"-axis position signal to a controller 39.

Figure 2:
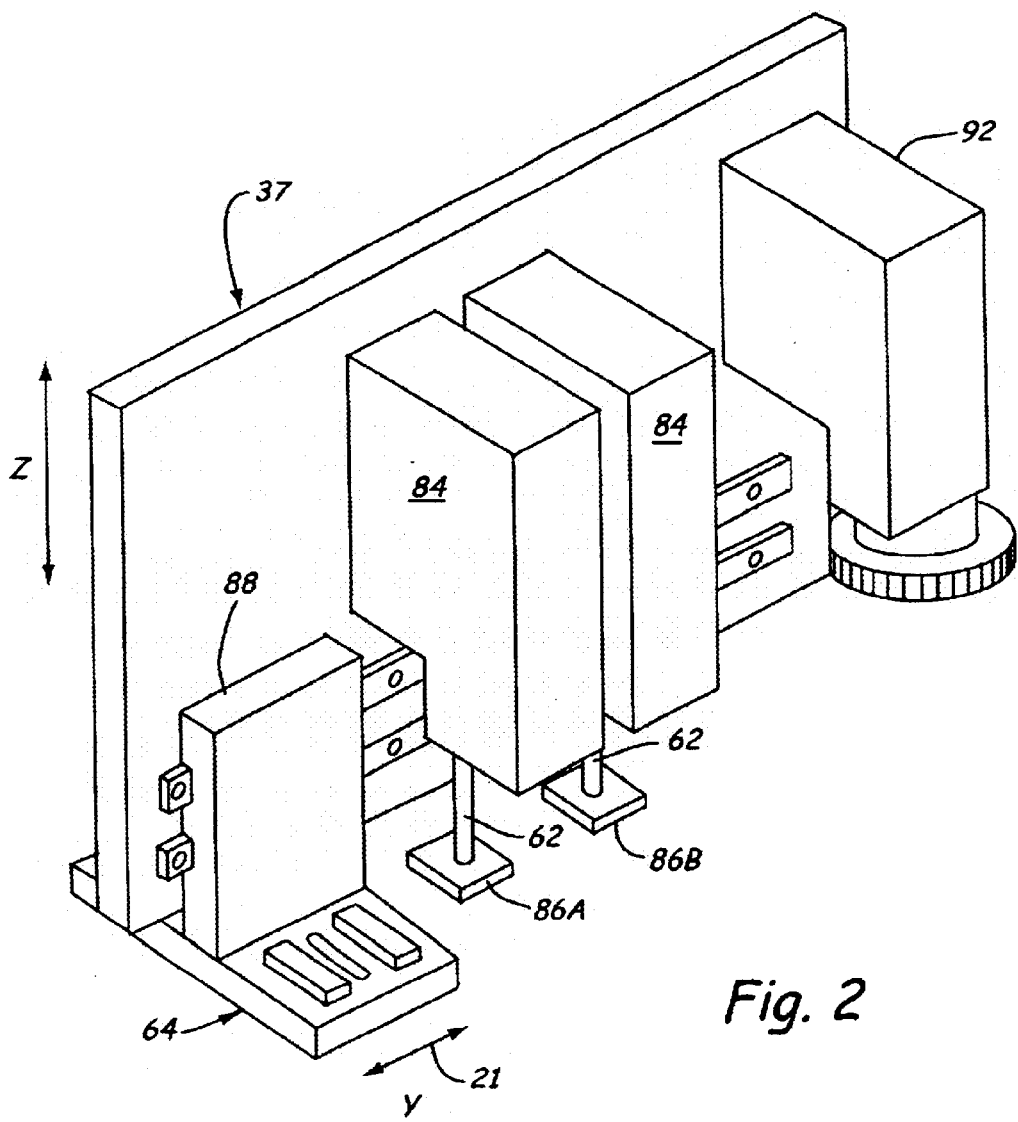
FIG. 2 is a perspective view of a pick and place head in accordance with an embodiment of the present invention.

Skipping ahead to FIG. 2, Linescan sensor 64 views the component from its underside, so a scanned image from sensor 64 may include detail of the underside of the component. The underside is typically the most detailed portion of the component, with fine pitch balls, columns, or other connection means may be present. The linescan sensor 64 also has the advantage of a variable field of view, with a variable resolution, so that as more detail is needed, the resolution and field of view may be appropriately adjusted.

Carriage 41 is mounted upon a pair of guide rails 46, and is movable along the X" axis, as indicated by arrow 22. Carriage 41 is coupled to drive motor 49 such that energization of motor 49 causes a displacement of carriage 41, and head 37 along the X" axis. Encoder 51 is coupled to motor 49 to provide a X"-axis position signal to the controller 39.

Pick and place machine 31 also includes controller 39 which receives the encoder position signals from encoders 42, 51, receives linescan image information from sensor 64 (shown in FIG. 2), and receives fiducial image data from camera 92 (shown in FIG. 2). As will be described in greater detail later in the specification, controller 39 computes physical characteristics for calibrating pick and place machine 31.

Other sorts of linescan sensors are adaptable for use with the present methods for calibration. For example, some high-capacity pick and place machines have a turret system with a rotating head which sequentially places components it picks up on a plurality of nozzles, all of which rotate around a central point in the rotating head. As for traditional X,Y translation gantry pick and place machines, some have recently been modified so that they have a small degree of movement in one dimension while the gantry is fixed in another orthogonal direction. Furthermore, it is understood that for any linescan sensor to scan an object of interest, there must either be movement of the sensor while the object is stationary, movement of the object of interest while the sensor is stationary, or movement of both sensor and object at the same time.

FIG. 2 is a perspective view of placement head 37 in accordance with an embodiment of the present invention. As can be seen, placement head 37 includes two vacuum pick-up nozzles 62, fiducial sensing camera 92, on-head linescan sensor 64, and linescan sensor stage 88. Nozzles 62 are coupled to pickup units 84 such that components 86A and 86B held by nozzles 62 can be translated up and down and rotated about their respective nozzle axes. Although two nozzles 62 are shown in FIG. 2, any suitable number of nozzles, including one nozzle, can be used to practice embodiments of the present invention.

Linescan sensor 64 is movably supported upon linear stage 88, such that linescan sensor 64 can move in the Y direction as indicated by arrow 21. A linear motor (not shown) provides the drive, but any mechanical arrangement for moving the stage 88 is acceptable. Fiducial camera 92 is disposed on head 37 and measures registration marks, or fiducials, on the workpiece. The locations of the fiducials are used in order to compute the placement location correction, as well as facilitate calibration, as will be described in greater detail later in the specification.

In order to calibrate pick and place machine 31, it is generally necessary to measure a number of physical characteristics of the pick and place machine. With these physical characteristics and knowledge of the mathematical relationship between the sensor coordinate system, the line scan stage coordinate system and the pick and place machine coordinate system, a processor in the system can compute instructions for moving the head to finally and accurately place the component in the intended location (this process is called "compensating" the position of the component). These characteristics include the Z-axis height of each nozzle tip on the placement head relative to some reference position of a Z position encoder in the pick and place machine, the location of each nozzle on the placement head, the effective axis of the linescan sensor, the horizontal scale factor of the linescan sensor, the vertical scale factor of the linescan sensor, and the runout of each nozzle.

All embodiments of the present invention utilize a linescan sensor for calibration, it is preferred that the first step in the calibration process is location of the Z-axis heights of the nozzle tips, such that later calibration steps can be performed at the focal plane of the linescan sensor, and thus be performed more accurately. Once the nozzle Z-heights are established, each nozzle can be adjusted for the proper Z-axis position so that all components and calibration targets are in best focus (i.e. positioned in the focal plane) when scanned by the linescan sensor.

Figure 3:
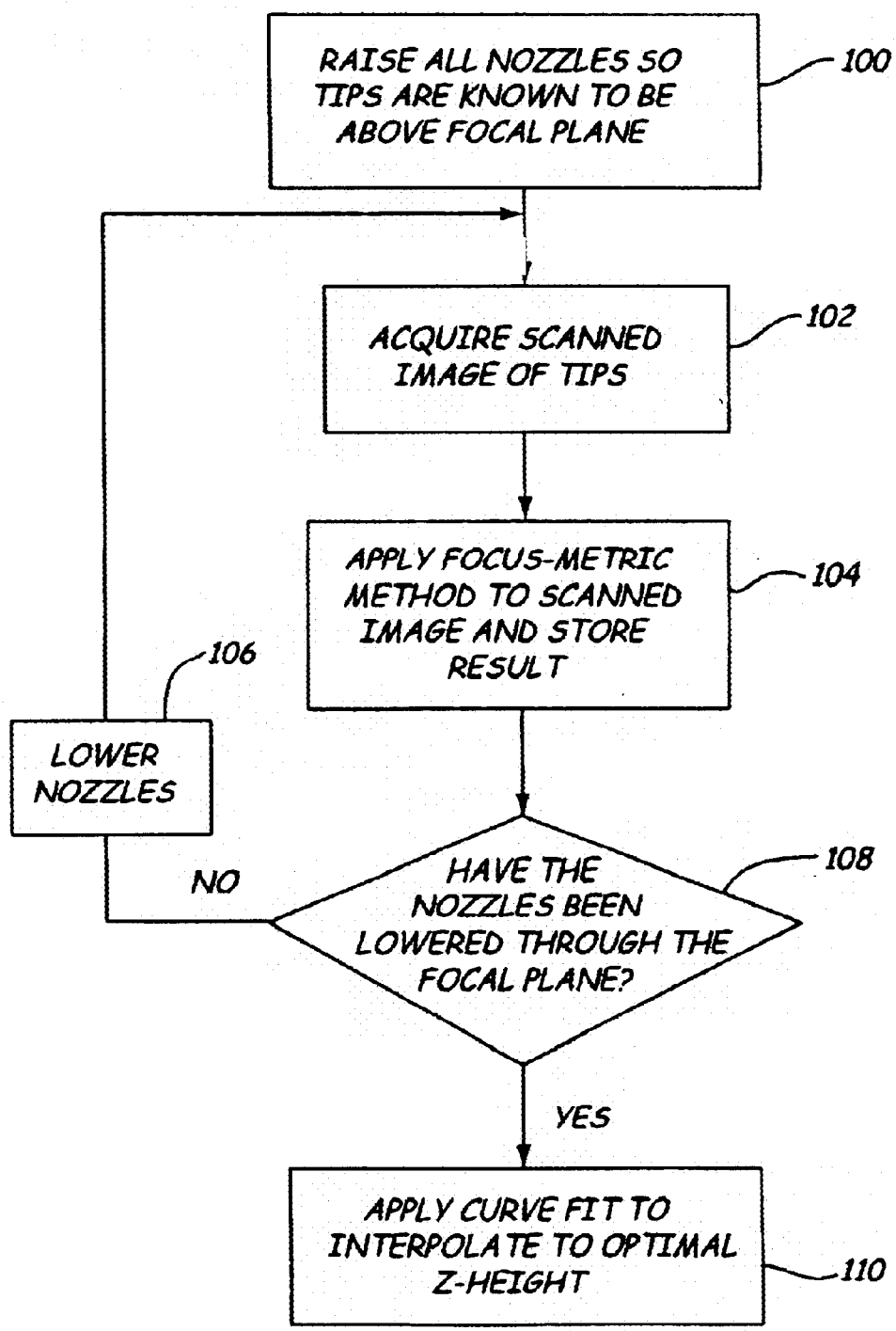
FIG. 3 is a block diagram of a method of calibrating a pick and place machine in accordance with an embodiment of the present invention.
Figure 4:
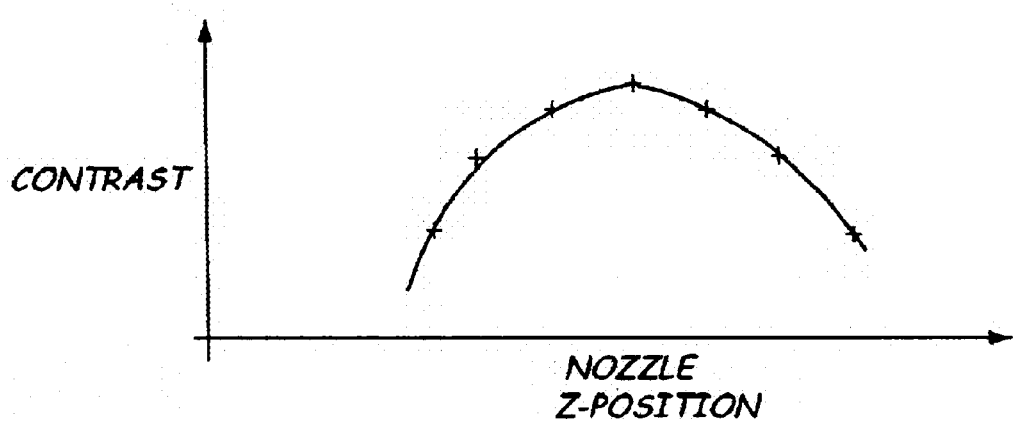
FIG. 4 is a chart of contrast vs. nozzle Z-position.

FIG. 3 shows one method of calculating the Z-heights in accordance with an embodiment of the present invention. The method shown in FIG. 3 can be considered an autofocus method for reasons which will become apparent during the description of FIG. 3. Prior to beginning of the method of FIG. 3, an illumination type is chosen that will highlight the sharp edges of each nozzle tip. Linescan sensors can employ sophisticated combinations of various illumination types, and a description of such illumination can be found in co-pending application Ser. No. 09/432,552 filed Nov. 3, 1999 entitled ELECTRONICS ASSEMBLY APPARATUS WITH IMPROVED IMAGING SYSTEM. Once the scanned image is acquired, a focus metric method is applied to the scanned image to provide a measure of the focus of the nozzle tips and finally, to compute the z elevation of the nozzle at which the nozzle tips are in best focus. Two embodiments for the focus metric method will be presented here, but other methods can be equally suitable.

The procedure begins at block 100 by raising each nozzle so that each tip is known to be above the Z location of the plane of best focus for the linescan sensor. Next, a scan of all nozzle tips is performed by translating linescan sensor 64 in the Y direction and acquiring a single image of all the nozzle tips in a scanned image, as indicated by block 102.

At block 104, a focus metric method is applied to the scanned images of the nozzle tips and the result is stored along with some indication of the presently set Z height. Although two embodiments for focus metric methods are described herein, it is understood that any method which identifies an optical Z height corresponding to the best focus of the nozzles will be adequate.

In a first embodiment of the focus metric method, a two dimensional Fourier transform is performed on the scanned images of the nozzle tips. Since the scanned images of the nozzle tips have a significant high-frequency content, a Fourier transform will permit analysis of the strength of the high frequency components, and thus the sharpness of the images. Other means for identifying high frequency portions of a scanned image may also be employed.

At block 108, the focus metric result from block 104 is compared to the previously stored focus metric results from images at previous nozzle Z positions. In this first embodiment of the focus metric method, the amplitude of selected high frequency spatial components in the Fourier transform of the scanned image is the measure of best focus. The amplitudes of the high frequency components for each nozzle increases until local maxima are achieved which corresponds roughly to the optimal Z height for best focus. After reaching the maxima, the amplitudes of the high frequency components begins to decrease. When these monitored amplitudes begin to decrease, the presently set Z height is less than the optimal Z height. As indicated in FIG. 3, if the Z height is not yet less than the optimal Z height, the nozzles are lowered at block 112 and the process starts again at block 102.

Otherwise, the process continues at block 110, where a fourth order polynomial is fit to the amplitude data in order to interpolate an optimal Z height for each nozzle that results in the highest contrast, and thus best focus. Curve fitting suppresses noise, and allows the selection of the optional focus point to be computed. Any suitable curve fitting method can be used to fit the results from the "focus-metric" method to any suitable mathematical model. The result of the curve fitting preferably facilitates interpolation of the Z height position of best focus for each nozzle from the "focus-metric" data.

Functions other than Fourier Transform amplitude may be used to measure the sharpness of the edges of the nozzles in the scanned image, and this information can then be used to compute when the image of the nozzle tips is in best focus.

An alternate focus metric method can be used in block 104 in FIG. 3. In this alternative focus metric, a template (i.e. expected image) of each nozzle tip is compared to the nozzle tip in the scanned image. The template can be constructed in software or a previously recorded image of the nozzle tip that is in sharp focus can be used. The normalized correlation algorithm returns a score indicating the quality of the template match, and the score is stored as a measure of the focus at each Z-height. When the correlation score is maximized, the scanned image of nozzle tips is in best focus. Various types of auto-focus methods, other than the normalized correlation and the Fourier transform method are equally suitable.

Figure 5:
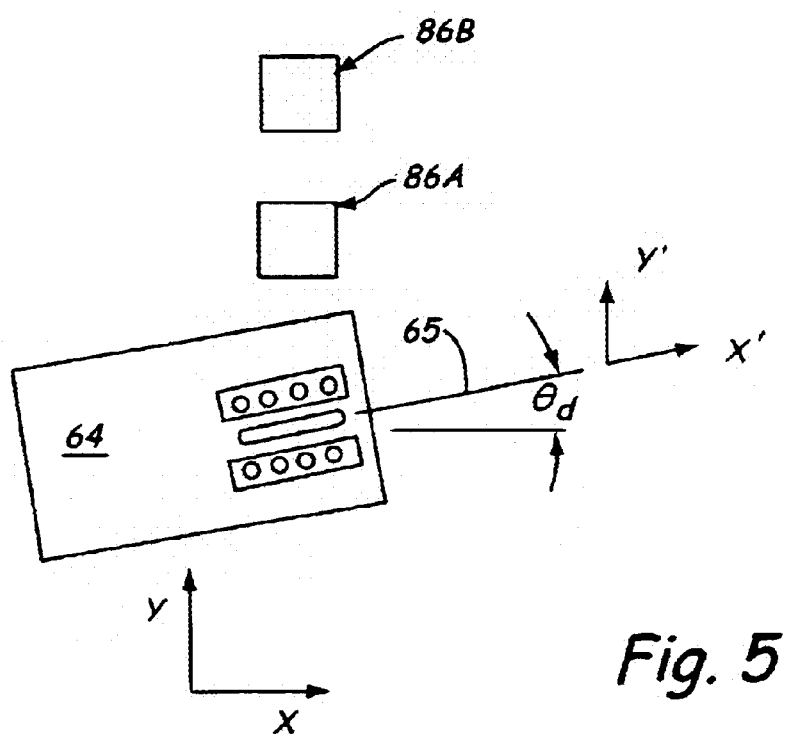
FIG. 5 is a diagrammatic view of a rotated linescan sensor.

The next preferred step in the calibration process is to make the effective axis of the linear detector within the linescan sensor perpendicular to the linescan sensor's direction of motion. If there is a tilt in this effective axis, then all images will appear to be sheared. FIG. 5 shows the effective axis 65 of the linear detector tilted at a greatly exaggerated angle $\theta_d$ with respect to the X axis. The Y axis in this figure is the direction of motion for linescan stage 88. Linescan stage 88 is omitted in FIG. 5 for clarity, but is shown in FIG. 2.

Figure 6:
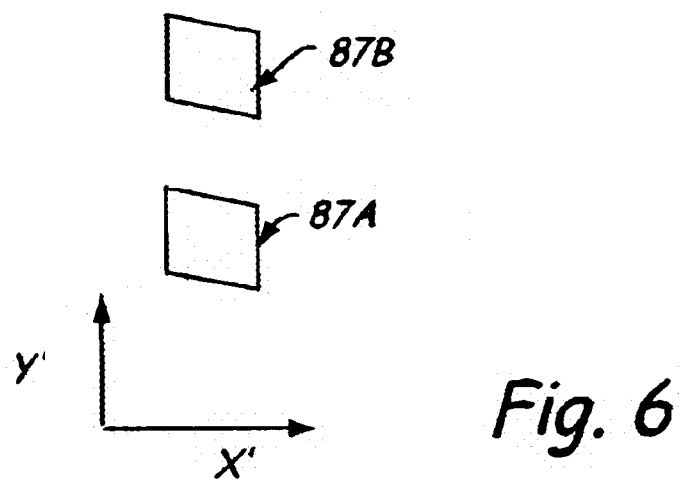
FIG. 6 is a diagrammatic view of sheared linescan images.

FIG. 6 shows the sheared images 87A and 87B of components 86A and 86B, respectively. Also, labeled in FIG. 6 is the X'-Y' coordinate system of the linescan sensor 64 as it appears in a captured video image. The procedure that follows uses the linescan sensor to scan a calibration target of known dimension that has been picked up by one of the nozzles. The detector tilt is calculated from this image of the calibration target.

If the detector tilt $\theta_d$, calculated below, is larger than the allowable tolerance, the linescan sensor housing is rotated in the X-Y plane on its mechanical mount. The rotation is accomplished by unscrewing bolts which fix sensor stage 88 into place on head 37 or other suitable mechanical means. Then, the procedure of scanning, calculating the detector tilt, and rotating the linescan sensor housing repeats until the detector tilt is within tolerance limits. Additionally, the horizontal and vertical scale factors of the linescan sensor are measured in the same procedure.

Figure 7:
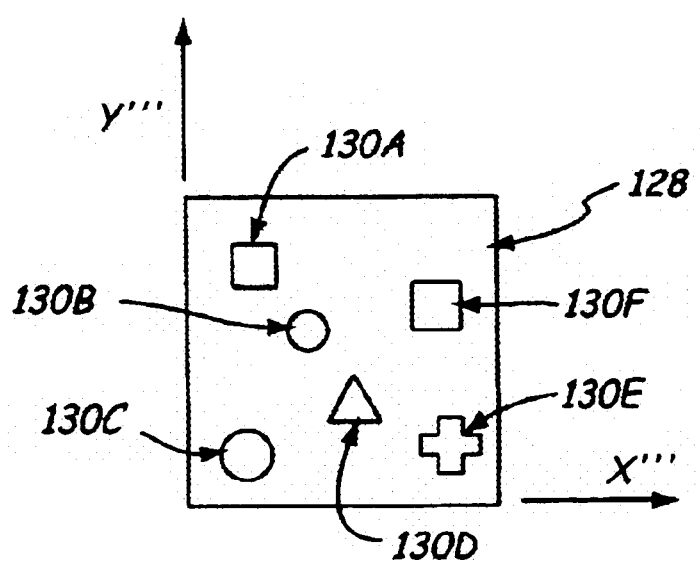
FIG. 7 is a diagrammatic view of a calibration target.

To measure the detector tilt, vertical scale factor and horizontal scale factor of the linescan sensor, a calibration target of known dimension is used. Preferably, this target is made by high precision photolithographic techniques. An example of a suitable calibration target 128 is shown in FIG. 7. Features 130A through 130F are known size, shape, and location in the X'''-Y''' coordinate system. These features are also referred to as fiducial marks.

Another type of calibration target 128 that has been successfully used has an orthogonal grid of squares patterned on it.

In general, the image of the features or grid will be sheared, rotated and have an offset in the linescan image.

Figure 8:
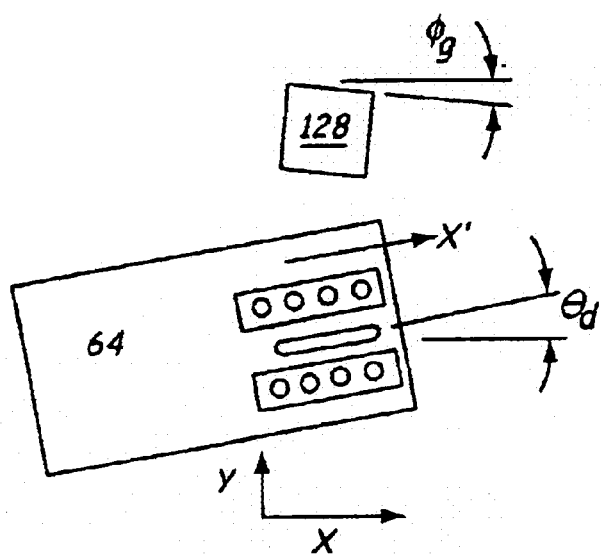
FIG. 8 is a diagrammatic view of a linescan sensor and calibration target in the X-Y coordinate system of the linescan sensor stage.

In FIG. 8 calibration target 128 is rotated by an amount $\theta_g$ with respect to the X axis.

Referring now back to FIGS. 5 and 6, we see that points in the linescan image are transformed to points in the coordinate frame of stage 88 by the relationship $$\begin{bmatrix} X \\ Y \end{bmatrix} = \begin{bmatrix} h\cos\theta_d & 0 \\ h\sin\theta_d & v \end{bmatrix} \begin{bmatrix} X' \\ Y' \end{bmatrix} \quad (1)$$

Where h and v are the horizontal and vertical scale factors, respectively, and Equation (1) accounts for both scale and shear.

FIG. 8 shows linescan sensor 64 prior to obtaining an image of calibration target 128. Calibration target is held by one of the vacuum nozzles (not shown). Calibration target is shown rotated by an amount $\theta_g$. In the stage coordinate frame, the positions of features 130A through 130F, ignoring offsets, are given by the rotation equation:

$$\begin{bmatrix} X \\ Y \end{bmatrix} = \begin{bmatrix} \cos\theta_g & -\sin\theta_g \\ \sin\theta_g & \cos\theta_g \end{bmatrix} \begin{bmatrix} X''' \\ Y''' \end{bmatrix} \quad (2)$$

Equating equations (1) and (2) gives:

$$\begin{bmatrix} h\cos\theta_d & 0 \\ h\sin\theta_d & v \end{bmatrix} \begin{bmatrix} X' \\ Y' \end{bmatrix} = \begin{bmatrix} \cos\theta_g & -\sin\theta_g \\ \sin\theta_g & \cos\theta_g \end{bmatrix} \begin{bmatrix} X''' \\ Y''' \end{bmatrix} \quad (3)$$

To compute the linear detector tilt, horizontal scale factor, and vertical scale factor, a geometric transformation is used. One geometric transformation, known as the affine transformation, can accommodate translation, rotation, scaling and shear. Further information about the affine transformation is provided in the monograph by George Wolberg entitled, "Digital Image Warping" (IEEE Computer Society Press, 1990).

Points in the X'-Y' linescan sensor image coordinate frame are mapped into the X'''-Y''' calibration target coordinate frame, preferably by the following affine transformation:

$$\begin{bmatrix} X''' \\ Y''' \end{bmatrix} = \begin{bmatrix} \alpha & \beta \\ \gamma & \delta \end{bmatrix} \begin{bmatrix} X' \\ Y' \end{bmatrix} + \begin{bmatrix} X'_0 \\ Y'_0 \end{bmatrix} \quad (4)$$

where ($X'_0$, $Y'_0$) is the offset of the calibration target 128 origin and $\alpha$, $\beta$, $\gamma$, $\delta$ describe the rotation, scale, and shear of the calibration target image. The location (X', Y') of each feature 130A through 130F is found in the linescan image by the normalized correlation method. Equation (4) is repeated for each feature 130A through 130F. The parameters $\alpha$, $\beta$, $\gamma$, $\delta$, $X'_0$, $Y'_0$ are then found by a known method such as the method of least squares, although other interpolation methods are suitable.

Substituting equation (4) into equation (3) gives:

$$\begin{bmatrix} h\cos\theta_d & 0 \\ h\sin\theta_d & v \end{bmatrix} \begin{bmatrix} X' \\ Y' \end{bmatrix} = \begin{bmatrix} \cos\theta_g & -\sin\theta_g \\ \sin\theta_g & \cos\theta_g \end{bmatrix} \begin{bmatrix} \alpha & \beta \\ \gamma & \delta \end{bmatrix} \begin{bmatrix} X' \\ Y' \end{bmatrix} \quad (5)$$

Again, the offsets are ignored since it is desired to only compute the detector tilt, horizontal scale factor, and the vertical scale factor.

If equation (5) holds for all $$\begin{bmatrix} X' \\ Y' \end{bmatrix}$$

then:

$$\begin{bmatrix} h\cos\theta_d & 0 \\ h\sin\theta_d & v \end{bmatrix} = \begin{bmatrix} \cos\theta_g & -\sin\theta_g \\ \sin\theta_g & \cos\theta_g \end{bmatrix} \begin{bmatrix} \alpha & \beta \\ \gamma & \delta \end{bmatrix} \quad (6)$$

Writing out the "northeast" equation of (6) gives:

$$\beta \cos\theta_g - \delta \sin\theta_g = 0 \quad (7)$$

Solving equation (7) for the tilt of the calibration target, $\theta_g$, gives:

$$\theta_g = \tan^{-1}\left(\frac{\beta}{\delta}\right) \quad (8)$$

By using standard trigonometric identities, equation (6) becomes $$\frac{1}{\sqrt{\beta^2+\delta^2}} \begin{bmatrix} \delta & -\beta \\ \beta & \delta \end{bmatrix} \begin{bmatrix} \alpha & \beta \\ \gamma & \delta \end{bmatrix} = \begin{bmatrix} h\cos\theta_d & 0 \\ h\sin\theta_d & v \end{bmatrix} \quad (9)$$

Solving equation (9) for detector tilt $\theta_d$, gives:

$$\theta_d = \tan^{-1}\left(\frac{\alpha\beta+\gamma\delta}{\alpha\delta-\beta\gamma}\right) \quad (10)$$

The horizontal and vertical scale factors are given by:

$$h = \sqrt{\alpha^2+\gamma^2}, \quad (11)$$

$$v = \sqrt{\beta^2+\delta^2} \quad (12)$$

Another method for computing detector tilt $\theta_d$ can be performed by imaging a target with a clearly delineated pattern on the target, such as a square or a rectangle. Once the scanned image of the target (which includes the pattern) is acquired, the slope of each of the line segments forming the pattern can be computed with commercially available machine vision software. With knowledge of the equation of at least two adjacent line segments in the rectangle, the angle, $\theta_d$, between the two line segments can be computed and compared to the expected angle between the line segments. Alternatively, one can compute $\theta_d$ and the scale factors by performing a transformation on at least three points, each point formed by the intersection of the line segments. Finally, the stage 88 is be mechanically adjusted by the angle $\theta_d$, thereby compensating for the initial detector stage tilt in subsequent measurements.

Figure 9:
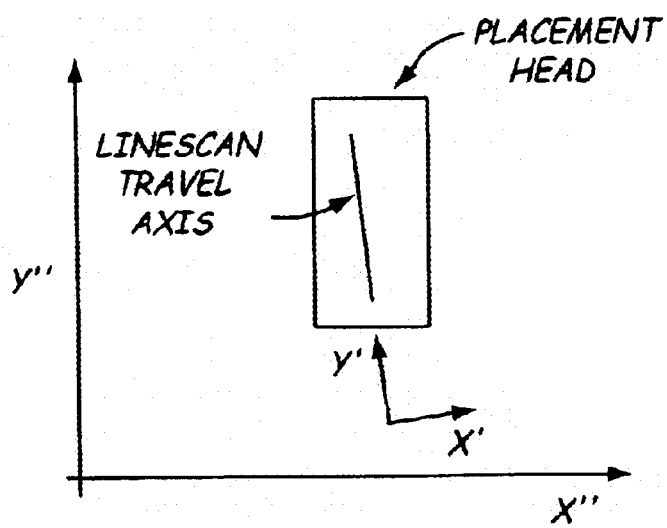
FIG. 9 is a diagrammatic view of a linescan sensor stage coordinate system as it relates to the coordinate system of a pick and place machine.

Once the linear detector tilt has been removed, the mapping of the linescan stage coordinate frame into the placement machine coordinate frame is determined. FIG. 9 shows an example where the coordinate axis of the on-head linescan sensor stage is tilted relative to the X"-Y" axes of the placement machine. (In the present placement machine embodiment, the placement head moves both in the X" and Y" axes. In other placement machine embodiments, the placement head may move in only the X" or Y" axis).

The procedure begins by picking up components labeled 86A and 86B as shown in FIG. 2. For simplicity, components 86A and 86B will be referred to as components A and B, respectively, hereinafter. For this calibration step, the components are preferably machined rectangular blocks. However, normal electrical components can also be used. Components A and B are then scanned by linescan sensor 64 and the center positions of components A and B are calculated. After components A and B have been scanned, they are placed on a target substrate. Fiducial camera 92 is then sequentially positioned over components A and B and their locations on the substrate are measured in the placement machine coordinate frame. Fiducial camera 92 travels and also measures in the placement machine coordinate frame because it is mounted to the placement head.

Figure 10A:
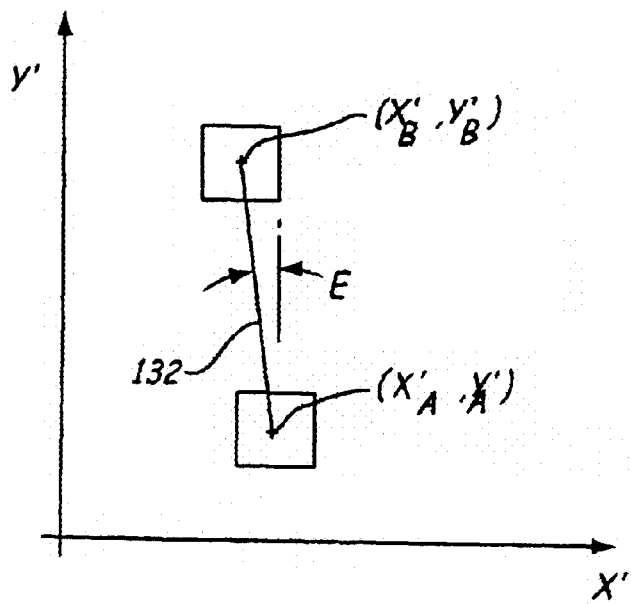
FIG. 10A is a diagrammatic view of components A and B as measured in a coordinate system of a linescan sensor.
Figure 10B:
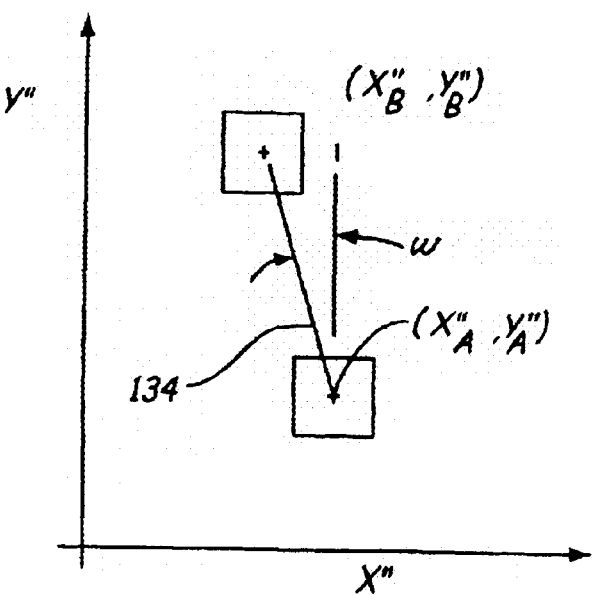
FIG. 10B is a diagrammatic view of components A and B as measured in a coordinate system of a pick and place machine.

FIG. 10A shows the locations ($X'_A$, $Y'_A$) and ($X'_B$, $Y'_B$) of components A and B, respectively, as measured by linescan sensor 64 in the single prime linescan coordinate system. Line 132 between these two points makes an angle $\epsilon$ with respect to the Y' axis. FIG. 10B shows the locations $(X''_A, Y''_A)$ and $(X''_B$ and $Y''_B)$ of components A and B, respectively, as measured by fiducial camera 92 in the double prime coordinate system of placement machine 31. Line 134 between these two points makes an angle $\omega$ with respect to the Y" axis. For this example, the two coordinate frames are rotated with respect to one another by an amount $\phi$ as given by equation (13). Equations (14) and (15) give expressions for $\epsilon$ and $\omega$.

$$\phi = \epsilon - \omega \tag{13}$$

$$\varepsilon = \tan^{-1}\left(\frac{X_{B'} - X_{A'}}{Y_{B'} - Y_{A'}}\right) \tag{14}$$

$$\omega = \tan^{-1}\left(\frac{X_{B'} - X_{A'}}{Y_{B'} - Y_{A'}}\right) \tag{15}$$

Converting measurements made in the prime coordinate frame of linescan sensor 64 (X',Y') into the double prime coordinate frame of placement machine (X",Y") by a translation and rotation is given by the following equation $$\begin{bmatrix} X'' \\ Y'' \end{bmatrix} = \begin{bmatrix} \cos\varphi & -\sin\varphi \\ \sin\varphi & \cos\varphi \end{bmatrix} \begin{bmatrix} X' \\ Y' \end{bmatrix} + \begin{bmatrix} X'_0 \\ Y'_0 \end{bmatrix} \tag{16}$$

The translation amounts $X'_0$ and $Y'_0$ may be calculated by substituting measured locations of either component A or B into equation (16). Doing this for the measured location of components A gives:

$$X'_0 = X''_A - X'_A \cos\phi + Y'_A \sin\phi \tag{17}$$

$$Y'_0 = Y''_A - X'_A \sin\phi - Y'_A \cos\phi \tag{18}$$

Figure 11:
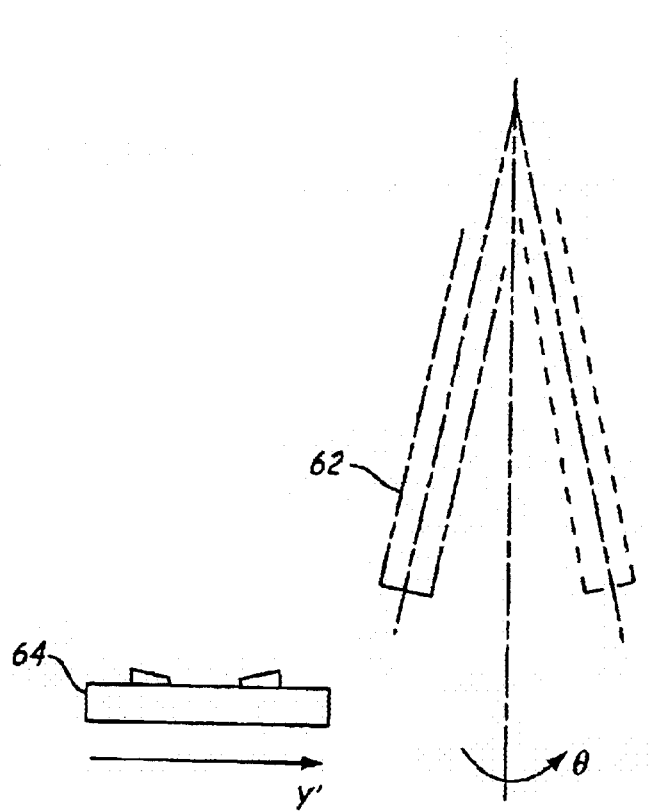
FIG. 11 is a diagrammatic view illustrating nozzle runout.
Figure 12:
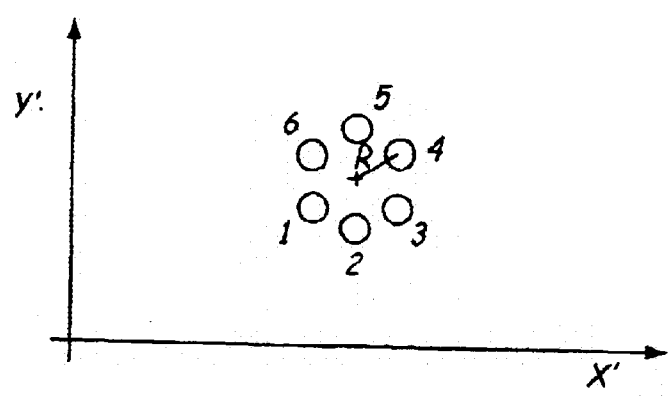
FIG. 12 is a top plan view illustrating nozzle tip positions at various angular orientations associated with the nozzle runout shown in FIG. 8.
Figure 13A:
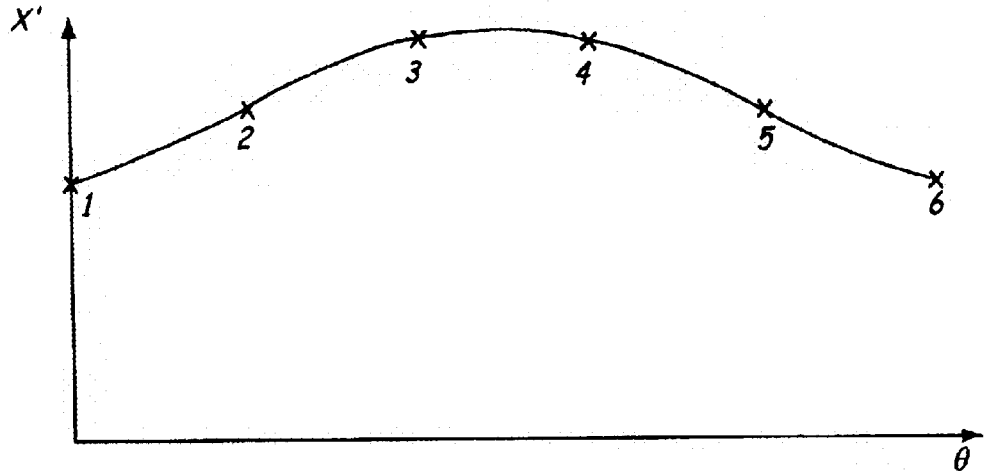
FIG. 13 is a pair of charts showing nozzle tip position along the X' and Y' axes vs. nozzle angle θ.
Figure 13B:
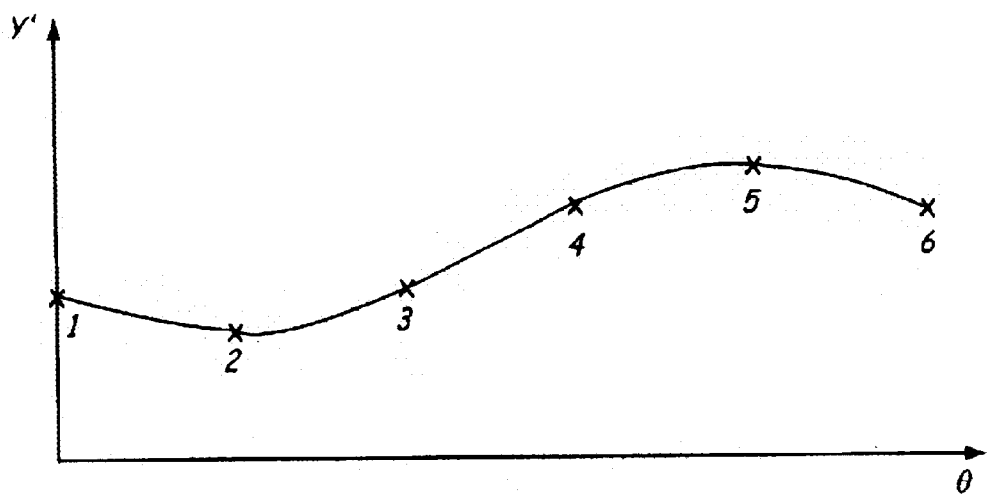

The accuracy of pick and place machine 31 is also improved by measuring the exact locations of the nozzles and measuring any mechanical runout of the nozzles as they are rotated. Runout refers to the offset of the nozzle tip from its effective axis of rotation, as measured in the plane of the nozzle tip. FIG. 11 shows a side view of a nozzle 62 with runout and the dotted line view of the same nozzle after it has been rotated 180°. To measure the nozzle locations and the associated runout, the nozzles are scanned and then their locations are computed by the normalized correlation method described earlier. The nozzles are then incremented in the θ direction and the procedure of scanning and measuring their locations by using the normalized correlation method is repeated until the nozzles have been rotated through 360°. FIG. 12 shows an example of one nozzle tip location for various nozzle angles. The circles labeled 1 through 6 in FIG. 12 are the nozzle tip images for this example. FIGS. 13A and 13B show the X' and Y' locations of the nozzle tip plotted against the θ position of the nozzle. Nozzle tip locations 1 through 6 are also labeled in FIGS. 13A and 13B. The nozzle runout axes and angles can be found from a best-fit sinusoidal curve to the X' and Y' locations as described below. FIGS. 13A and 13B also show these best-fit sinusoidal curves. The equations for the tip position of nozzle number k are given by:

$$X'_k = X'_{ck} + R_k \cos(\theta_k - \xi_k) \tag{19}$$

$$Y'_k = Y'_{ck} + R_k \sin(\theta_k - \xi_k) \tag{20}$$

where the center of rotation for nozzle number k is given by the coordinate $(X'_{ck}, Y'_{ck})$ and the radius of revolution is given by $R_k$. The angle of the nozzle is $\theta_k$ and $\xi_k$ is an angular offset.

To solve equations (19) and (20) for the nozzle center position, the radius, and the angular offset, the following parameters $a_k$ and $b_k$ are defined $$a_k = R_k \cos \xi_k \tag{21}$$

$$b_k = R_k \sin \xi_k \tag{22}$$

Using the standard trigonometric angle-difference formulas, equations (19) and (20) become $$\begin{bmatrix} X'_k \\ Y'_k \end{bmatrix} = \begin{bmatrix} \cos\theta_k & \sin\theta_k \\ \sin\theta_k & -\cos\theta_k \end{bmatrix} \begin{bmatrix} a_k \\ b_k \end{bmatrix} + \begin{bmatrix} X'_{ck} \\ Y'_{ck} \end{bmatrix} \tag{23}$$

The method of least squares is then used to compute $a_k$, $b_k$, and the center of rotation for each nozzle. The radius of revolution and the angular offset are then given by $$R_k = \sqrt{a_k^2 + b_k^2} \tag{24}$$

$$\xi_k = \tan^{-1}\left(\frac{b_k}{a_k}\right) \tag{25}$$

When a component must be rotated after having been measured by linescan sensor 64 and prior to placement, the difference in nozzle center position for the two angles is computed. The difference is then applied to the correction amount measured by the linescan sensor. Further information regarding the correction amount calculation can be found in the co-pending U.S. patent application listed above.

From FIGS. 13A and 13B, it should be apparent that nozzle runout could become a large error source when the component must be rotated through a large angle because it was picked up in a different orientation than it is to be placed on the printed circuit board. It is typical to rotate a component approximately −90°, 90°, or 180° prior to placement. To reduce the amount of runout correction necessary, components may be pre-rotated to their approximate placement orientation before scanning with the linescan sensor. This pre-rotation can take place while the nozzle is retracted in a position for scanning, or the pre-rotation can take place while the nozzle is being retracted after part pick-up.

Although the present invention has been described with reference to preferred embodiments, workers skilled in the art will recognize that changes may be made in form and detail without departing from the spirit and scope of the invention. In particular, the calibration methods of the present invention can be readily expanded to multiple nozzles.

What is claimed is:

1. A method calibrating a pick and place machine having a physical coordinate system and at least one nozzle, the method comprising:

attaching a target to the at least one nozzle;

imaging the target with an on-head line scan sensor to provide a scanned image expressed in terms of a linescan coordinate system; and computing a mapping between the physical coordinate system and the linescan coordinate system based on at least two features of the target; and computing a physical characteristic as a function of the mapping.

2. The method of claim 1 where the scanned image includes a pattern, and the step of computing the mapping includes computing at least one equation modeling at least a portion of the pattern, where the computed equation is compared to an expected equation of the pattern, and a detector tilt is computed therefrom.

3. The method of claim 1 where the scanned image includes a pattern, and the step of computing the mapping includes computing at least three points, each point formed by an intersection of two line segments related to the pattern, where the transformation of the at least three points yields a detector tilt.

4. The method of claim 1 where the step of computing the mapping includes computing a mathematical relationship among the pick and place coordinate system, a coordinate system describing the stage of the linescan sensor, a coordinate system describing the target and the linescan coordinate system.

5. The method of claim 4 where the step of computing the mapping includes performing a geometric transform between at least two of the coordinate systems.

6. The method of claim 5 where the geometric transform is an affine transform.

7. The method of claim 1 where the physical characteristic is a tilt of the linescan coordinate system relative to the physical coordinate system.

8. The method of claim 7 further comprising picking up a component with the at least one nozzle and positioning the component.

9. The method of claim 1 where the target has a grid pattern thereon.

10. The method of claim 1 where the physical characteristic is a scale factor of the linescan coordinate system.

11. The method of claim 10 where the scale factor is expressed with respect to a vertical axis.

12. The method of claim 10 where the scale factor is expressed with respect to a horizontal axis.

13. The method of claim 10 further comprising picking up a component with the at least one nozzle and using the scale factor to position the component.

* * * * *